United States Patent
Kim et al.

[11] Patent Number: 6,087,712
[45] Date of Patent: Jul. 11, 2000

[54] LEAD FRAME CONTAINING LEADS PLATED WITH TIN ALLOY FOR INCREASED WETTABILITY AND METHOD FOR PLATING THE LEADS

[75] Inventors: Joong-Do Kim; Young-Ho Baek, both of Kyungki-do, Rep. of Korea

[73] Assignee: Samsung Aerospace Industries, Ltd., Rep. of Korea

[21] Appl. No.: 08/998,475

[22] Filed: Dec. 26, 1997

[51] Int. Cl.[7] .......................... H01L 23/48; H01L 29/40; H01L 23/495; H01L 23/52

[52] U.S. Cl. .......................... 257/666; 257/677; 257/692; 257/772; 257/779; 257/767; 257/676; 257/741; 438/111

[58] Field of Search ...................................... 257/666, 676, 257/787, 677, 692, 668, 767, 762–766, 772, 779, 741; 438/111

[56] References Cited

U.S. PATENT DOCUMENTS

| | | | |
|---|---|---|---|
| 4,065,625 | 12/1977 | Iwai et al. | 428/596 |
| 4,441,118 | 4/1984 | Fister et al. | |
| 4,707,278 | 11/1987 | Breyer et al. | 251/122 |
| 4,942,455 | 7/1990 | Shinohara | 257/646 |
| 4,959,278 | 9/1990 | Shimauchi et al. | 428/642 |
| 5,041,901 | 8/1991 | Kitano et al. | 257/779 |
| 5,134,459 | 7/1992 | Maeda et al. | 257/666 |
| 5,329,158 | 7/1994 | Lin | 257/666 |
| 5,360,991 | 11/1994 | Abys et al. | 259/666 |
| 5,521,432 | 5/1996 | Tsuji et al. | 257/677 |
| 5,616,953 | 4/1997 | King et al. | 257/666 |
| 5,635,755 | 6/1997 | Kinghorn | 257/666 |
| 5,710,064 | 1/1998 | Song et al. | 257/666 |
| 5,723,900 | 3/1998 | Kojima et al. | 257/666 |
| 5,767,574 | 6/1998 | Kim et al. | 257/677 |
| 5,780,931 | 7/1998 | Shimoda et al. | 257/779 |
| 5,877,543 | 3/1999 | Matsubara et al. | 257/674 |
| 5,882,955 | 3/1999 | Hunag et al. | 438/111 |

FOREIGN PATENT DOCUMENTS

| | | |
|---|---|---|
| 0 250 146 | 12/1987 | European Pat. Off. . |
| 0 335 608 | 3/1989 | European Pat. Off. . |
| 51-115775 A1 | 10/1976 | Japan . |
| 60-147148 | 8/1985 | Japan . |
| 62-105457 A1 | 5/1987 | Japan . |
| 63-2358 | 1/1988 | Japan . |

OTHER PUBLICATIONS

*Standard Microsoldering Technology*, published Nov. 30, 1992.

*Primary Examiner*—Alexander Oscar Williams
*Attorney, Agent, or Firm*—Alston & Bird LLP

[57] ABSTRACT

The lead frame includes outer leads plated with tin (Sn) alloy so as to withstand the high temperatures generated during a subsequent semiconductor packaging process. In addition to the outer leads, the lead frame includes a die pad and inner leads composed of a base metal, such as copper (Cu), a copper alloy, or a nickel alloy. The die pad and the inner leads are plated with silver for improved conductivity. In order to withstand relatively high temperatures as well as to resist corrosion and have good solder wettability, the outer leads are preferably plated with a tin antimony alloy, such as a tin-antimony alloy consisting of 90±5 weight percent of tin and 10±5 weight percent antimony. Alternatively, the outer leads can be plated with a tin-antimony-lead alloy, such as a tin-antimony-lead alloy consisting of 10±5 weight percent of tin, 10±5 weight percent of antimony and 80±10 weight percent of lead. A method of plating a lead frame is also provided.

8 Claims, 5 Drawing Sheets

| Au |
| Pd |
| Pd – Ni |
| Au strike |
| Ni |
| Base Metal |

LEAD FRAME CONTAINING LEADS PLATED WITH TIN ALLOY FOR INCREASED WETTABILITY AND METHOD FOR PLATING THE LEADS

FIELD OF THE INVENTION

The present invention relates generally to a lead frame and a method for plating a lead frame and, more particularly, to a lead frame and a method for at least partially plating the lead frame with a tin (Sn) alloy so as to readily withstand the high temperatures incurred during a subsequent semiconductor packaging process.

BACKGROUND OF THE INVENTION

During the manufacture of an integrated circuit device (also known as a semiconductor chip), a package is created which encapsulates the integrated circuit. Although ceramic packages are available, packages are commonly formed of a plastic material, such as epoxy. In order to establish connections to each input/output terminal of the encapsulated chip, a lead frame is also formed and at least partially encapsulated within the package. By wire bonding each input/output terminal of the semiconductor chip to the lead frame prior to encapsulation, each input/output terminal of the semiconductor chip can be electrically contacted following encapsulation by establishing appropriate connections with the portion of the lead frame that extends outside the package. The lead frame can have a variety of shapes depending upon the density and integration of the semiconductor chip and the method of mounting the resulting integrated circuit device to a printed circuit board (PCB).

A lead frame connects the encapsulated semiconductor chip to the PCB. As shown in FIG. 1, a lead frame has two main parts, namely, a die pad unit 1 to which the semiconductor chip is attached or mounted, and a plurality of leads 2 concentrated around the die pad unit 1 and extending outwardly from the die pad unit 1. Each lead 2 includes an inner lead 21 which is wire bonded to an input/output terminal of the semiconductor chip and an outer lead 22 which is connected to the PCB. The input/output terminals of the semiconductor chip are connected through wire bonding to respective inner leads 21 of the lead frame prior to encapsulating the semiconductor chip in a plastic or ceramic package. For a plastic package, a plastic material is typically injection molded about the semiconductor chip mounted to the die pad unit 1 and the inner leads 21. As such, the inner leads 21 are frequently covered with epoxy resin during the molding process.

During construction of the lead frame, the die pad unit 1 and the inner leads 21 are generally partially plated with silver (Ag) for increasing their conductivity. Also, the outer leads 22 are typically plated with solder (Sn/Pb) after the epoxy molding process so as to permit more efficient soldering. When plating the outer leads with the solder, however, the solder commonly penetrates the package of the inner leads 21. Accordingly, an additional, typically wet process step must be performed to eliminate the solder that has penetrated to the inner leads 21. Since a wet process is executed after the epoxy molding process, the reliability of the resulting integrated circuit will generally decrease.

In attempt to solve these deficiencies with conventional lead frame construction techniques, a preplated frame (PPF) method was developed. In the PPF method, a plating layer having excellent solder wettability is deposited on the lead frame prior to encapsulating the semiconductor chip and a portion of the lead frame in a package. In a general PPF method, a layer of palladium (Pd) or palladium alloy is deposited on the lead frame. However, since palladium is a precious metal, the general PPF method raises the price of the lead frame. Also, a galvanic coupling phenomenon occurs between the palladium and iron alloy materials from which the lead frame is constructed. Because of the galvanic coupling phenomenon the lead frame will continue to develop corrosion products.

In a further attempt to overcome these shortcomings, a palladium PPF method was developed. In the palladium PPF method, the base metal of the lead frame is plated with a plurality of layers, as described below.

FIGS. 2A–2C are schematic cross-sectional, views of a lead frame plated according to various palladium PPF methods. As shown in FIG. 2A, the lead frame includes a base metal such as copper, a layer of nickel on the base metal, a layer of palladium nickel alloy on the nickel layer, and a layer of palladium on the palladium-nickel alloy. See Japanese Patent Laid - Open Publication Sho 63-2358. As shown in FIG. 2B, the lead frame includes a base metal, a layer of palladium-nickel alloy on the nickel strike layer, a layer of nickel on the palladium nickel alloy layer, and a layer of palladium on the nickel layer. See European Patent Application No. 0 250 146 and European Patent Application No. 0 335 608. As shown in FIG. 2C, a lead frame includes a base metal, a layer of nickel on the base metal, a layer of gold (Au) strike on the nickel layer, a layer of palladium-nickel alloy on the gold strike layer, a layer of palladium on the palladium nickel alloy layer, and a layer of gold on the palladium layer. See U.S. Pat. No. 5,350,991. Unfortunately, none of these palladium PPF methods completely overcome the corrosion problem.

Yet another process for fabricating a lead frame is the two color plating method. In the two color plating method, the outer leads of the lead frame are plated with solder (Sn/Pb) during the process of fabricating the lead frame and prior to encapsulating the semiconductor chip and a portion of the lead frame in the package. The two color plating method increases the reliability of the resulting packaged integrated circuit device since the wet processing step is omitted, thereby also decreasing the price of the lead frame.

FIG. 3 is a phase diagram of solder for plating a lead frame according to conventional techniques. As shown in FIG. 3, the eutectic temperature of the solder (Sn/Pb) is about 183° C. which is much less than the temperatures required during encapsulation of the semiconductor chip in the package. For example, encapsulation techniques commonly require temperatures of over 250° C. which will deleteriously affect the solder.

SUMMARY OF THE INVENTION

It is an object of the present invention to provide a lead frame at least partially plated with a tin (Sn) alloy containing antimony (Sb) so as to withstand the high temperatures encountered during an encapsulation process.

It is also an object of the present invention to provide a method for at least partially plating a lead frame with a tin (Sn) alloy containing antimony (Sb) so as to withstand the high temperature encountered during a subsequent encapsulation process.

To achieve these objects and in accordance with the purpose of the invention as embodied and broadly described herein, the lead frame of the present invention includes a die pad on which an integrated circuit or semiconductor chip is attached or mounted and a plurality of leads concentrated around the die pad and extending outwardly from the die pad. Each lead includes an inner lead disposed adjacent to the die pad, and an outer lead which serves to electrically connect the respective inner lead to external circuitry, such as a printed circuit board. A layer of silver (Ag) is typically formed on the die pad and the inner leads. According to one embodiment, a layer of tin antimony (Sn/Sb) alloy is formed on the outer leads. Advantageously, the tin antimony alloy includes 50 to 90±5 weight percent of tin and 50 to 10±5 weight percent of antimony. According to another embodiment, a layer of tin-antimony-lead (Sn/Sb/Pb) alloy is formed on the outer leads. Preferably, one tin-antimony-lead alloy includes 10±5 weight percent of tin, 10±5 weight percent of antimony and 80±10 weight percent of lead. According to another aspect of the present invention, a method of fabricating a lead frame is provided. According to one embodiment, the method includes the steps of plating the die pad and inner leads of a lead frame with silver, and plating the outer leads of the lead frame with a tin antimony alloy. According to another embodiment, the method includes the steps of plating the die pad and inner leads of a lead frame with silver, and plating the outer leads of the lead frame with a tin-antimony-lead alloy. Once the lead frame has been plated according to either embodiment, the semiconductor chip can be mounted to the die pad and the semiconductor chip and a portion of the lead frame, i.e., the die pad and the inner leads, can be encapsulated in a package.

By plating the lead frame according to the present invention, the lead frame can readily withstand the high temperatures, such as 250° C., that will be necessary during the encapsulation process. In particular, tin is innocuous, resists corrosion well, and has excellent solder wettability, while antimony has a high melting point and is relatively hard. In the embodiment in which a tin-antimony-lead alloy is plated upon the outer leads, the lead raises the operation efficiency of the plating layers since lead has good wettability and a high melting point. Accordingly, the lead frame of either embodiment can readily withstand the high temperatures generated during the encapsulation process, while resisting corrosion and providing excellent solder wettability.

BRIEF DESCRIPTION OF THE DRAWINGS

The accompanying drawings, which are incorporated in and constitute a part of this specification, illustrate one embodiment of the invention and, together with the description, serve to explain the principles of the invention.

In the drawings.

DETAILED DESCRIPTION OF THE PREFERRED EMBODIMENTS

The present invention will now be described more fully hereinafter with reference to the accompanying drawings, in which a preferred embodiment of the invention is shown. This invention may, however, be embodied in many different forms and should not be construed as limited to the embodiments set forth herein; rather, this embodiment is provided so that this disclosure will be thorough and complete and will fully convey the scope of the invention to those skilled in the art. Like numbers refer to like elements throughout.

Reference will now be made in detail to one advantageous embodiment of the lead frame of the present invention, an example of which is illustrated in the accompanying drawings. In this regard, FIG. 4 is a schematic cross-sectional view of a lead frame plated in accordance with one preferred embodiment of the present invention.

Figure 1:
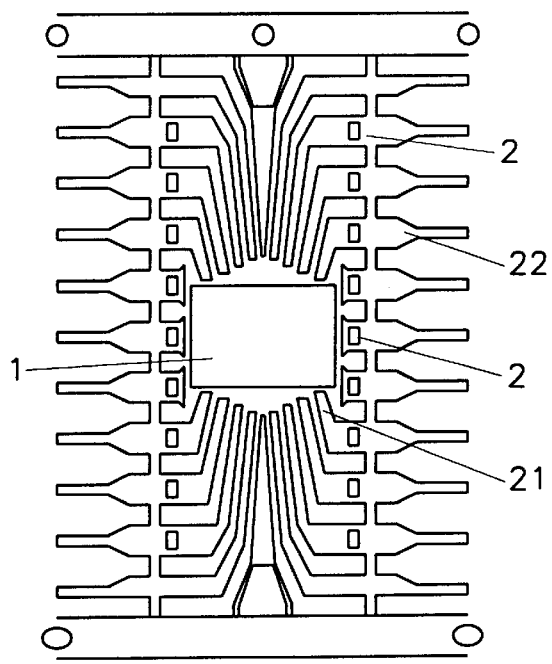
FIG. 1 is a schematic representation of a top view of a typical lead frame.
Figure 2A:
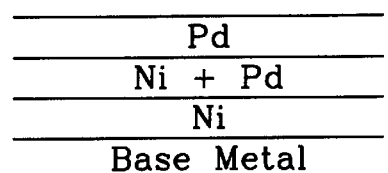
FIGS. 2A–2C are schematic cross-sectional views of a lead frame plated according to conventional techniques.
Figure 2B:
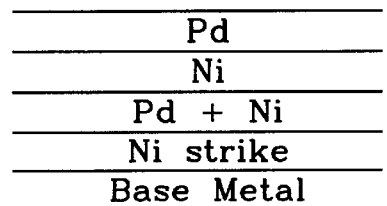
Figures 2C, 4:
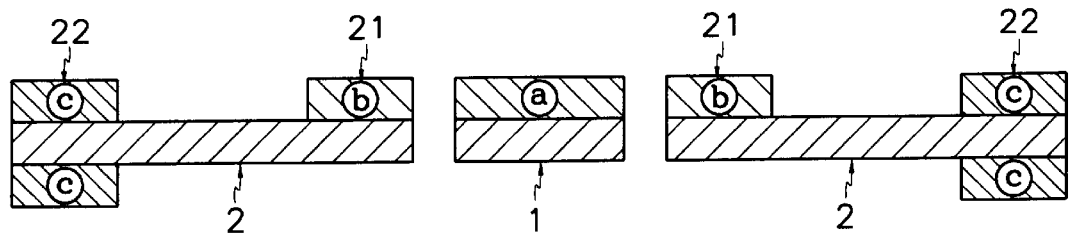
FIG. 4 is a schematic cross-sectional view of a lead frame plated in accordance with one advantageous embodiment of the present invention.
Figure 3:
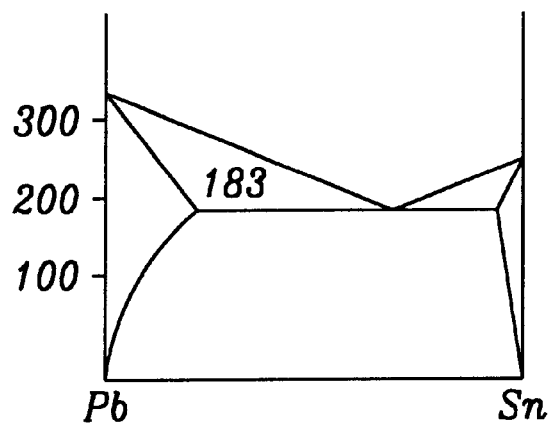
FIG. 3 is a phase diagram of solder for plating a lead frame according to conventional techniques.

As shown in FIG. 4, a lead frame includes a die pad unit 1 and leads 2 which are formed on both sides of the die pad unit 1. For example, the leads 2 may be concentrated around the die pad unit a as shown in FIG. 1. However, the leads can be arranged in other configurations without departing from the spirit and scope of the present invention. The leads 2 include inner leads 21 which are adjacent to or proximate the die pad unit 1 and outer leads 22 which will serve to electrically connect the inner leads 21 to external circuitry, such as a printed circuit board.

The die pad unit 1 and the leads 2 include a base metal. Typically, the base metal is copper (Cu), a copper alloy, or a nickel alloy. While the base metal can have a variety of thicknesses, the thickness of the base metal is generally between 0.1 millimeters to 3 millimeters.

A layer of silver plating a is formed on the die pad unit 1. A layer of silver plating b is also formed on each inner lead 21. Further, a layer of tin alloy plating c is formed on each outer lead 22. As shown in FIG. 4, the tin alloy can be formed on both opposed surfaces of the outer leads. However, the tin alloy can be formed of a single surface on the outer leads, if so desired.

According to one advantageous embodiment, the tin alloy plating layer c is composed of tin and antimony. The tin-antimony alloy plating layer c of this embodiment preferably includes 50 to 90±5 weight percent of tin and 50 to 10±5 weight percent of antimony. For example, the tin-antimony alloy plating layer c of one preferred embodiment includes 90 weight percent of tin and 10 weight percent of antimony. According to another advantageous embodiment, the tin alloy plating layer c is composed of tin, antimony and lead. According to this embodiment, the tin-antimony-lead alloy plating layer c includes 10±5 weight percent of tin, 10±5 weight percent of antimony and 80±10 weight percent of lead. For example, the tin-antimony-lead alloy plating layer c of one preferred embodiment includes 10 weight percent of tin, 10 weight percent of antimony and 80 weight percent of lead.

Figure 5:
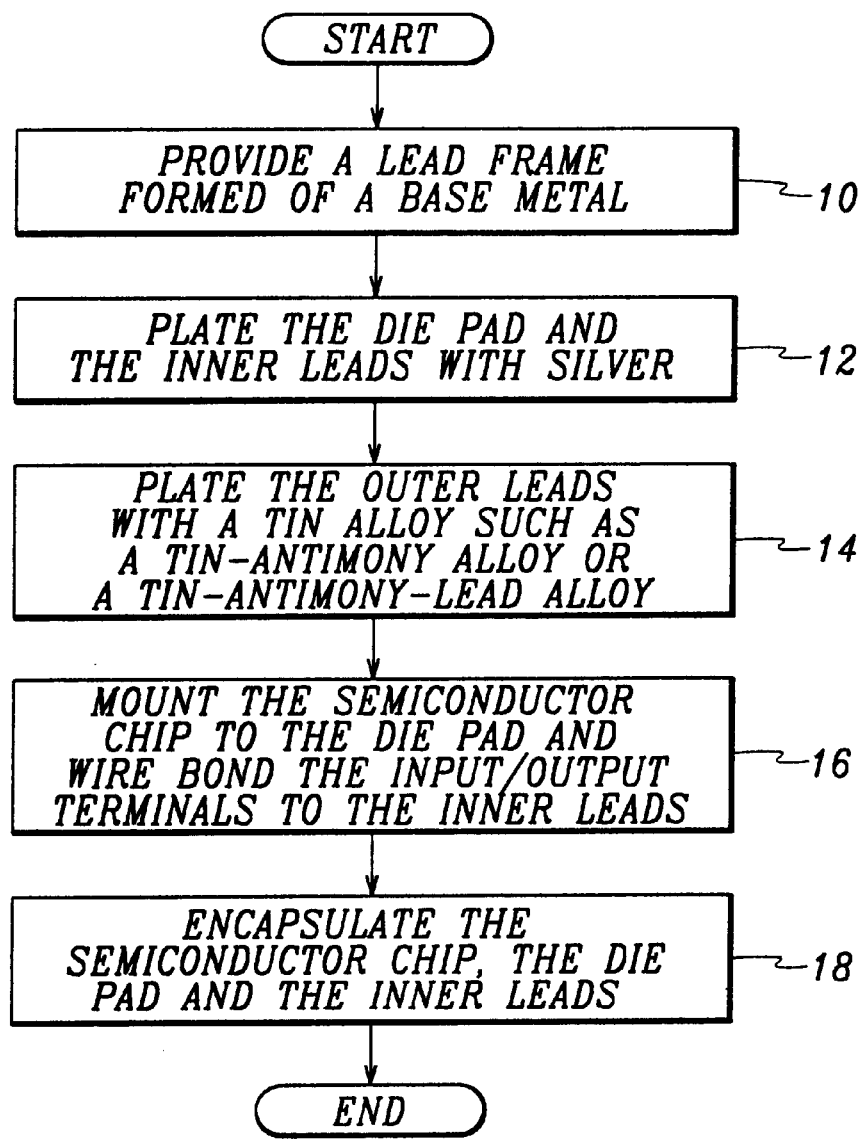
FIG. 5 is a block diagram illustrating the operations performed during the plating of a lead frame according to the present invention.

As shown in FIG. 5, a method is also provided according to the present invention for plating a lead frame. Once the base metal lead frame is provided as shown in block 10, the base metal of the die pad unit 1 and the inner leads 21 is preferably plated with silver as shown in block 12. Thereafter, the base metal of the outer leads 22 is plated with a tin alloy.

According to one advantageous embodiment of the method of the present invention, the outer leads 22 are plated with a tin-antimony alloy and, more preferably, with a tin-antimony alloy that include 50 to 90±5 weight percent of tin and 50 to 10±5 weight percent of antimony.

Figure 6:
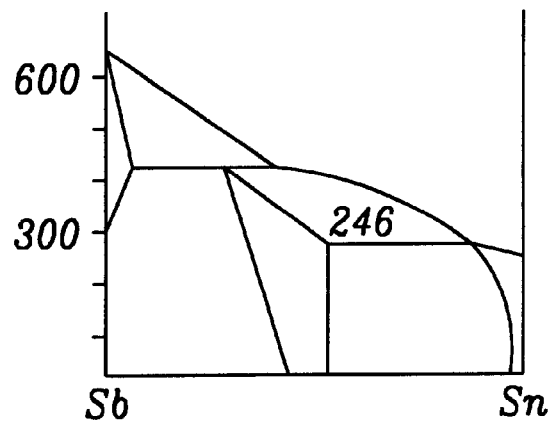
FIG. 6 is a phase diagram of a tin-antimony alloy for plating a lead frame in accordance with one advantageous embodiment of the present invention.

FIG. 6 is a phase diagram of a tin-antimony alloy for plating the outer leads 22. As shown in FIG. 6, a peritectic temperature is 246° C. Here, the melting point when the tin-antimony alloy includes 90 weight percent of tin and 10 weight percent of antimony is higher than the temperature required during encapsulation of the semiconductor chip in the package, for example 250° C. The melting point of the tin-antimony alloy depends on the antimony and tin contents in the alloy. As the antimony has a high melting point and a high hardness, the higher the antimony content in the tin-antimony alloy the higher the melting point and the hardness should be. Accordingly, the tin-antimony alloy has the antimony content preferably ranging from 10 to 50 weight percent and the tin content preferably ranging from 90 to 50 weight percent. Consequently, the tin-antimony alloy can readily withstand the high temperature.

According to another advantageous embodiment of the method of the present invention, the outer leads 22 are plated with a tin-antimony-lead alloy and, more preferably, a tin-antimony-lead alloy that includes 10±5 weight percent of tin, 10±5 weight percent of antimony and 80±10 weight percent of lead.

Figure 7:
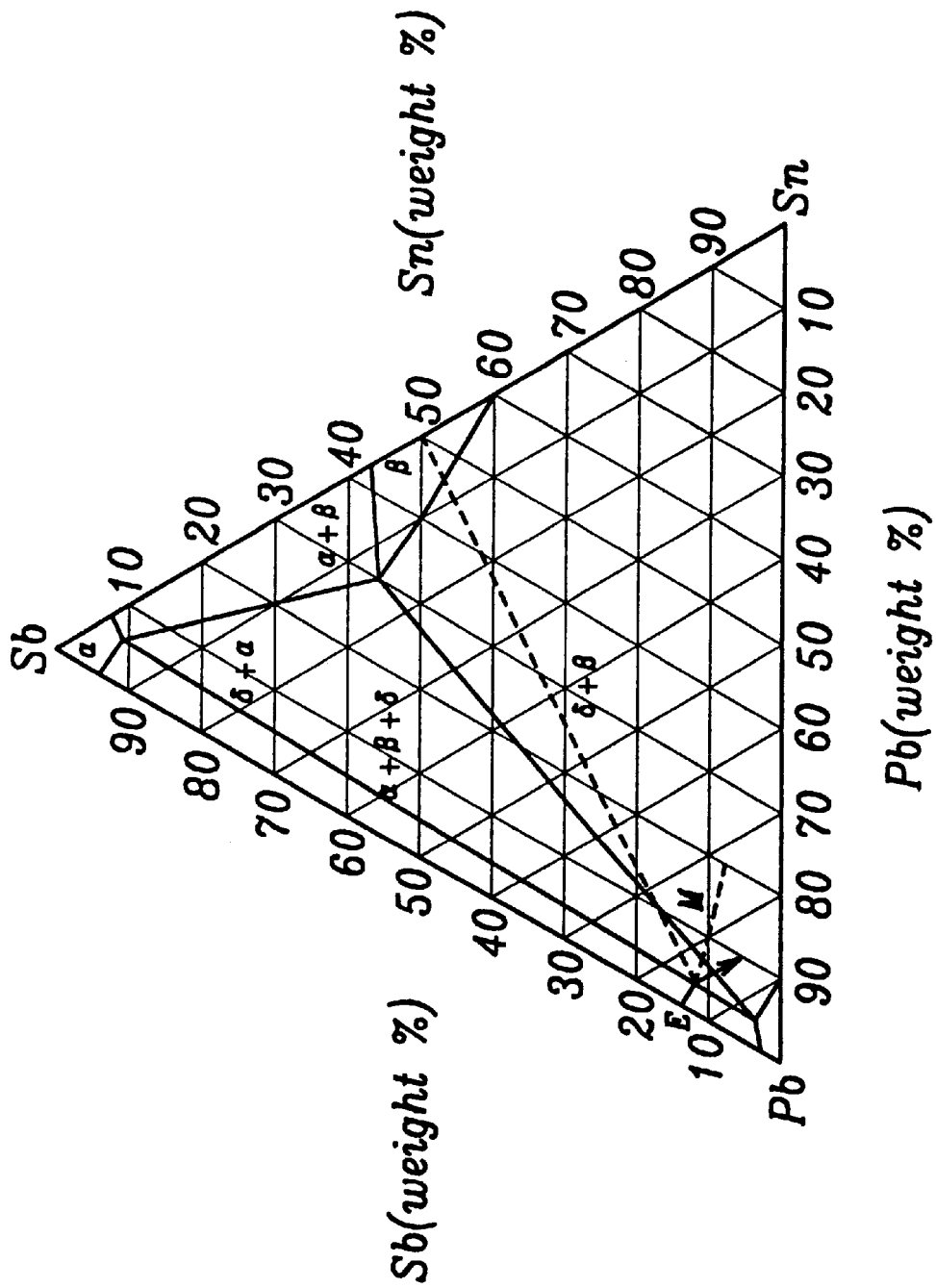
FIG. 7 is a phase diagram of a tin-antimony-lead alloy for plating a lead frame in accordance with another advantageous embodiment the present invention.

FIG. 7 is a phase diagram of a tin-antimony-lead alloy for plating the outer leads 22 in temperatures 240° C. As shown in FIG. 7, a peritectic temperature is 240° C., which is higher than the eutectic temperature of the solder. Consequently, the tin-antimony alloy can readily withstand the high temperatures.

Once the lead frame has been plated as described above, the integrated circuit or semiconductor chip is mounted to the die pad unit 1, typically by means of an adhesive or solder, as shown in block 16. As also shown in block 16, the input/output terminals of the integrated circuit or semiconductor chip are also typically wire bonded to respective inner leads 21. Thereafter, the integrated circuit or semiconductor chip as well as the die pad unit 1 and the inner leads 21 are encapsulated in a package that is generally formed of a plastic material or a ceramic material. See block 18. With respect to a package formed of a plastic material, the plastic is generally injection molded about the integrated circuit and a portion of the lead frame, i.e., the die pad unit 1 and the inner leads 21. As such, the outer leads 22 of the lead frame that are pleated with either a tin antimony alloy or a tin antimony lead alloy extend from the package for establishing electrical contact between an external circuit, such as a PCB, and the inner leads 21 and, in turn, the integrated circuit mounted upon the die pad unit.

By plating the lead frame according to the present invention, the lead frame can readily withstand the high temperatures, such as 250° C., that will be necessary during the encapsulation process. In particular, tin is innocuous, resists corrosion well, and has excellent solder wettability, while antimony has a high melting point and is relatively hard. In the embodiment in which a tin antimony lead alloy is plated upon the outer leads, the lead raises the operation efficiency of the plating layers since lead has good wettability and a high melting point. Accordingly, the lead frame of either embodiment can readily withstand the high temperatures generated during the encapsulation process, while resisting corrosion and providing excellent solder wettability.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are not used in a generic and descriptive sense only and not for purposes of limitation.

That which is claimed is:

1. A lead frame comprising:
    a die pad for receiving an integrated circuit; and
    a plurality of leads disposed about and extending outwardly from said die pad, wherein each lead comprises an inner lead adjacent to said die pad and an outer lead plated with an outermost layer of tin-antimony alloy for establishing electrical contact between said respective inner lead and extend circuitry, wherein said outer-most layer of tin-antimony alloy comprises 50 to 90±5 weight percent of tin and 50 to 10±5 weight percent of antimony, and wherein said die pad and said inner leads comprise a silver layer.

2. A lead frame according to claim 1, wherein said die pad and said leads comprise a base metal selected from the group consisting of copper, a copper alloy and a nickel alloy, and wherein the base metal has a thickness between 0.1 millimeters and 3 millimeters.

3. A lead frame comprising:
    a die pad for receiving an integrated circuit; and
    a plurality of leads disposed about and extending outwardly from said die pad, wherein each lead comprises an inner lead adjacent to said die pad and an outer lead plated with an outer-most layer of tin-antimony-lead alloy for establishing electrical contact between said respective inner lead and external circuitry, wherein said outer-most layer of tin-antimony-lead alloy comprises 10±5 weight percent of tin, 10±5 weight percent of antimony, and 80±10 weight percent of lead, and wherein said die pad and said inner leads comprise a silver layer.

4. A lead frame according to claim 3, wherein said die pad and said leads comprises a base metal selected from the group consisting of copper, a copper alloy and a nickel alloy, and wherein the base metal has a thickness between 0.1 millimeters and 3 millimeters.

5. A method for plating a lead frame comprising the steps of:
    providing the lead frame comprising a die pad and a plurality of leads extending outwardly from the die pad, wherein each lead comprises an inner lead adjacent to the die pad and a respective outer lead;
    plating the die pad and the inner leads of the lead frame with silver; and
    plating the outer leads of the lead frame with an outermost layer with tin-antimony alloy comprising 50 to 90±5 weight percent of tin and 50 to 10±5 weight percent of antimony.

6. A method according to claim 5, wherein said providing step comprises providing a die pad and leads comprised of a base metal selected from the group consisting of copper, a copper alloy and a nickel alloy and having a thickness between 0.1 millimeters and 3 millimeters.

7. A method for plating a lead frame comprising the steps of:

providing the lead frame comprising a die pad and a plurality of leads extending outwardly from the die pad, wherein each lead comprises an inner lead adjacent to the die pad and a respective outer lead;

plating the die pad and the inner leads of the lead frame with silver; and plating the outer leads of the lead frame with an outermost layer of tin-antimony-lead alloy comprising 10±5 weight percent of tin, 10±5 weight percent of antimony, and 80±10 weight percent of lead.

8. A method according to claim 7, wherein said providing step comprises providing a die pad and leads comprised of a base metal selected from the group consisting of copper, a copper alloy and a nickel alloy and having a thickness between 0.1 millimeters and 3 millimeters.

* * * * *